United States Patent [19]

Leon et al.

[11] Patent Number: 5,428,560
[45] Date of Patent: Jun. 27, 1995

[54] SIMULATOR, IN PARTICULAR OF THERMAL BATTERIES

[75] Inventors: Serge Leon, Cachan; Patrick Grain, Guyancourt; Serge Bard, Cachan, all of France

[73] Assignee: Aerospatiale Societe Nationale Industrielle, Paris, France

[21] Appl. No.: 40,932

[22] Filed: Mar. 31, 1993

[30] Foreign Application Priority Data

Apr. 8, 1992 [FR] France ................................. 92 04302

[51] Int. Cl.$^6$ .......................... G06G 7/62; G06G 7/48
[52] U.S. Cl. ...................................... 364/578; 364/802; 364/806; 364/492; 364/495; 136/200; 136/224; 136/201
[58] Field of Search ............... 364/578, 801, 802, 806, 364/492, 495; 136/200, 224, 201

[56] References Cited

U.S. PATENT DOCUMENTS

| | | | |
|---|---|---|---|
| 2,802,624 | 8/1957 | Kayan | 364/806 |
| 3,961,173 | 6/1976 | Perry et al. | 364/802 |
| 4,216,421 | 8/1980 | Dupont | 364/802 |
| 4,499,552 | 2/1985 | Kanazawa | 364/802 |

FOREIGN PATENT DOCUMENTS

| | | |
|---|---|---|
| 0359237A3 | 3/1990 | European Pat. Off. . |
| 3420889A1 | 12/1985 | Germany . |
| 3823640A1 | 1/1990 | Germany . |

OTHER PUBLICATIONS

Knight et al. "The validation of a thermal battery model using electrically-inert and active batteries" 1990, 141–144.

Wells et al., "Thermal Battery Performance Demonstration for Advanced Tactical and Strategic Applications" 1990, 156–159.

Derwent Publications Ltd., London, GB; (Week 8929); AN 89213201 & SU-A-1 453 420 (Mizrakh) Jan. 23, 1989.

Primary Examiner—Emanuel T. Voeltz
Assistant Examiner—Alan Tran
Attorney, Agent, or Firm—Frishauf, Holtz, Goodman & Woodward

[57] ABSTRACT

A simulator, in particular for simulating thermal batteries, the simulator delivering an output voltage $U_{bat}$ across output terminals thereof, said output voltage being a function of a current $I_{out}$ delivered, into a load connected to said terminals, and of an e.m.f. parameter. $E_g$ and of an internal resistance parameter $R_g$ that are determined from simulation profiles that give successive values taken by said parameters under real battery operating conditions during an active life cycle of a given battery. The simulator includes computer equipment delivering the simulation profiles in the form of e.m.f. references $C_{Eg}$ and internal resistance references $C_{Rg}$ to a battery simulation card which, in order to generate the output voltage $U_{bat}$ of the simulator at the output of said voltage programmable power supply feeds said power supply with a battery voltage reference $C_{Ubat}$ determined on the basis of a measurement of the current delivered by said power supply and on the basis of the e.m.f. reference and the internal resistance reference as received from the computer equipment.

3 Claims, 3 Drawing Sheets

Fig_1

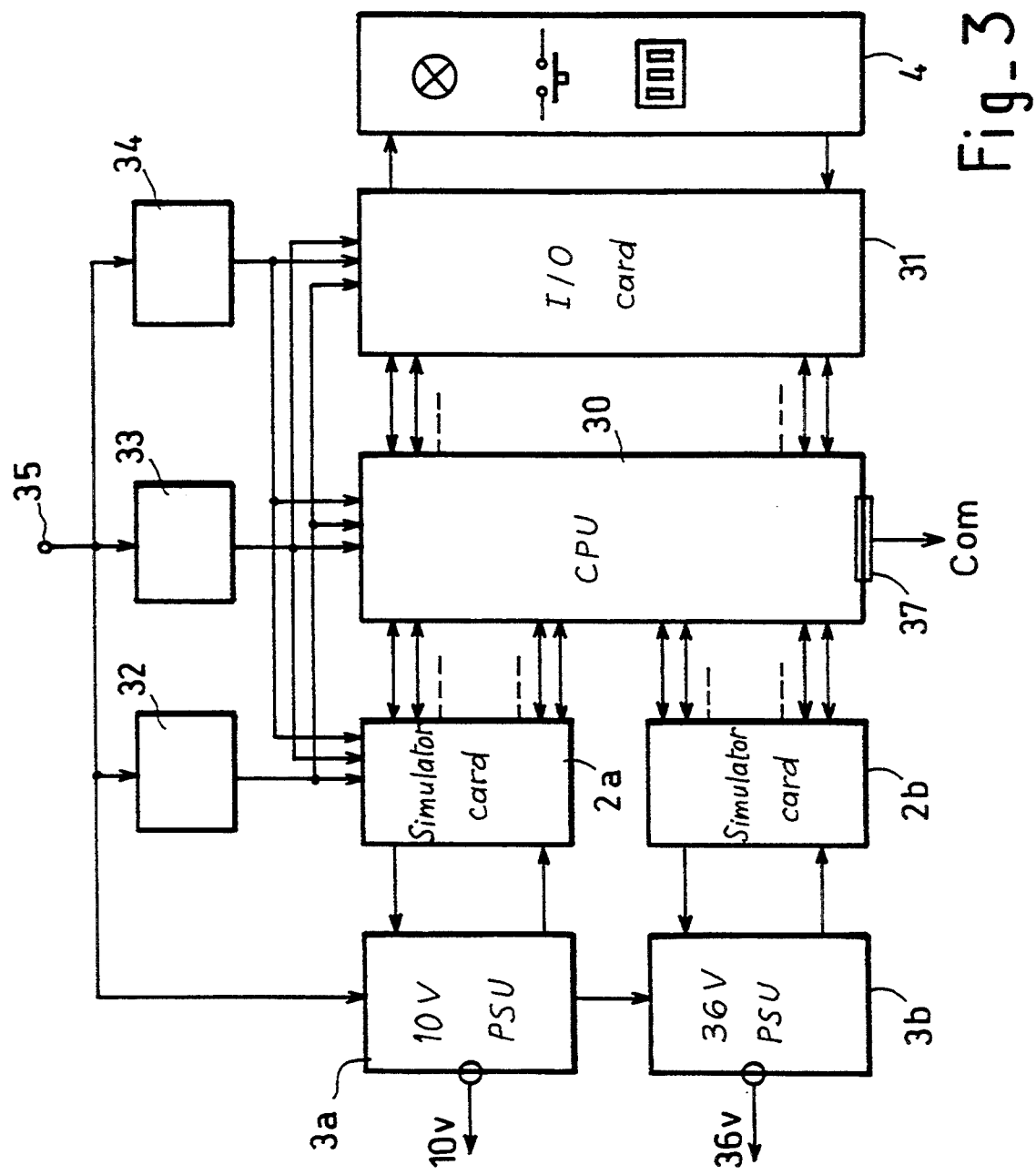

SIMULATOR, IN PARTICULAR OF THERMAL BATTERIES

The present invention relates to a simulator intended mainly, but not exclusively, for use in developing devices that are designed to run on thermal batteries.

BACKGROUND OF THE INVENTION

A thermal battery comes in the form of a metal box which is completely sealed, is generally cylindrical, and is fitted on one of its faces with user terminals.

A thermal battery contains the same essential elements as a conventional battery: a metal cathode, a metal anode, and insulating plates impregnated with a depolarizer or electrolyte, and assembled together in cells that are identical. A plurality of such cells are stacked inside the box which is sealed by means of a lid bearing the user terminals and which is secured by crimping and then by welding.

The special feature of a thermal battery lies in that its electrolyte is in the form of a solid, and no electromotive force (e.m.f.) can be established until the electrolyte has been fused. The electrolyte is fused, i.e. the battery is activated, by igniting disks made of a pyrotechnical composition placed between each adjacent pair of unit cells in the battery, and triggered by an electrical detonator.

This physical special feature of thermal batteries gives rise, in particular, to unusual electrical characteristics such as a very large amount of variation in the two conventional parameters of a battery: namely its e.m.f. and its internal resistance, with this variation taking place over a short period of time, of the order of a few tens to a few hundreds of seconds, between the battery being triggered and the battery coming to the end of its active life.

This very short lifetime during which the thermal battery is active constitutes a severe drawback while developing and testing devices that are designed to run on such batteries. During development and testing, it is necessary to be able to power such devices, sometimes for several hours at a time, and using genuine thermal batteries would give rise to prohibitive costs during testing. In addition, the restrictive safety conditions that accompany the use of such pyrotechnical devices and the difficulties involved in implementing a component of that type make it very difficult, if not impossible, to use a thermal battery during development and testing. Thus, during tests., a manufacturer is reduced to replacing the thermal battery with such test equipment as may be available.

Three types of equipment are presently available for replacing thermal batteries:

A power supply that is constant, using series regulation or a chopper circuit.

Such a power supply provides a steady voltage (i.e. an almost perfect e.m.f., optionally associated with an on/off switch) regardless of the load applied thereto, i.e. regardless of the current delivered, in other words:

$$U_{bat}=E_{ps}=\text{Const.}, \forall t, \forall I_{out}$$

A power supply that is programmable over a standardized IEEE 488 bus.

Controlled by a computer, a power supply of this type delivers a voltage that is variable as a function of digital control words it receives, as interpreted by the standardized coupler of the apparatus, in which case:

$$U_{bat}=E_{ps}=k_1 i, \forall I_{out}, k_1 \in \Re$$

A power supply that is programmable by an analog reference voltage.

The reference signal may be provided, for example, by a random signal generator, with the output voltage of the power supply being capable of describing any variable waveform (reference image) that is modifiable at will, but that is still independent of the applied load, in other words:

$$U_{bat}=E_{ps}=k_2 C_{Eg}(t), \forall I_{out}, k_2 \in \Re$$

Regardless of the solution chosen from the above, the voltage delivered is always a nearly perfect e.m.f., even if it does vary over time. Under no circumstances can the current delivered give rise to a change in the output voltage level, and this is not representative of the behavior of a thermal battery.

It is therefore clear that there exists a need for a system that is capable of simulating the behavior of thermal batteries more faithfully so as to facilitate developing equipment that is designed to run on thermal batteries: e.g. power supply converters or control actuators.

OBJECTS AND SUMMARY OF THE INVENTION

An object of the invention is to provide such a thermal battery simulator capable of reproducing as faithfully as possible the variations in e.m.f. and internal resistance that are observed during the active cycle of such batteries under real operating conditions.

Another object of the invention is to provide a device that is simple and reliable and easy to use.

These objects are achieved by a simulator, in particular for thermal batteries, the simulator delivering a voltage $U_{bat}$ across its output terminals, wherein said output voltage $U_{bat}$ is a function of a current $I_{out}$ delivered into a load connected to its output terminals, and an e.m.f. parameter $E_g$ and an internal resistance parameter $R_g$ which are determined from simulation profiles specifying the successive values taken by said parameters during an active life cycle of a given battery under real operating conditions.

Such variation both in the e.m.f. and in the internal resistance of a battery, or more generally in any voltage source having dynamic internal resistance, makes it possible to simulate in representative manner the real behavior of such devices in which variations in these parameters are considerable, particularly in the case of thermal batteries.

The simulator of the invention includes computer equipment delivering said simulation profiles in the form of a reference e.m.f. $C_{Eg}$ and of a reference internal resistance $C_{Rg}$ to a battery simulation card which in turn delivers a battery voltage reference $C_{Ubat}$ to a voltage-programmable DC power supply, where $C_{Ubat}$ is determined on the basis of a measurement of the current delivered by said power supply and of both the reference e.m.f., and the reference internal resistance as received from the computer equipment, thereby causing the output of said programmable power supply to deliver the output voltage $U_{bat}$ of the simulator.

Said computer equipment includes a memory storing simulation profiles, with an operator interface providing overall control of the simulator being connected to said computer equipment. In addition, the assembly is connected to a computer platform which also provides overall control of the simulator and remote acquisition of various simulation profiles, as well as performing modelling.

These various elements constitute a simulator for a voltage generator having dynamic internal resistance, which simulator is particular, simple to use and to implement, and is capable, in particular, of providing very large amounts: of variation in said internal resistance over a wide range of values while simultaneously conveying a load current that may be greater than 10 amps.

The battery voltage reference $C_{Ubat}$ is obtained by the difference between the reference e.m.f. $C_{Eg}$ and a reference representative of the voltage drop in the internal resistance of the battery $C_{RI}$, itself obtained by analog multiplication of the reference internal resistance $C_{Rg}$ coming from digital-to-analog transformation of a corresponding digital value reference delivered by the computer equipment, multiplied by the delivered current $C_{Iout}$ resulting from an analog measurement of the current delivered by the programmable-power power supply.

By such implementation of a combined method that uses both analog and digital means, it is possible to simplify implementation of the simulator, and simulation profiles that are available in the form of digital files in the computer equipment can be made use of directly.

Advantageously, the simulator may be usable in single voltage form at 24 V, or in multiple voltage form (in particular in two-voltage form: 10 V and 36 V), in the operations involved for missile acceptance, thereby enabling test firings to be performed as often as may be necessary without using up a new thermal battery on each occasion.

BRIEF DESCRIPTION OF THE DRAWINGS

Other features and advantages appear more clearly from the following description made with reference to the accompanying drawings, in which:

FIG. 3 is a simplified block diagram of a two-voltage battery simulator of the invention.

MORE DETAILED DESCRIPTION

To a first approximation, it may be assumed that the two essential parameters of a thermal battery are its e.m.f. and its internal resistance $R_g$. The equation modelling a thermal battery is thus as follows:

$$U_{bat} = Eg - (Rg \times I_{out})$$

The parameters Eg and Rg are two variables that may be described by functions of time: $C_{Eg}(t)$ and $C_{Rg}(t)$ which are provided either by the battery manufacturer or else by analyzing tests performed on real thermal batteries.

$$Eg = \alpha \times C_{Eg}(t), \alpha \in \Re$$

$$Rg = \alpha \times C_{Rg}(t), \beta \in \Re$$

The parameter $I_{out}$ depends on the instantaneous value of the pair (Eg, Rg) and on a load provided by the equipment connected at any given instant to the terminals of the battery while it delivers a voltage $U_{bat}$.

Figure 1:
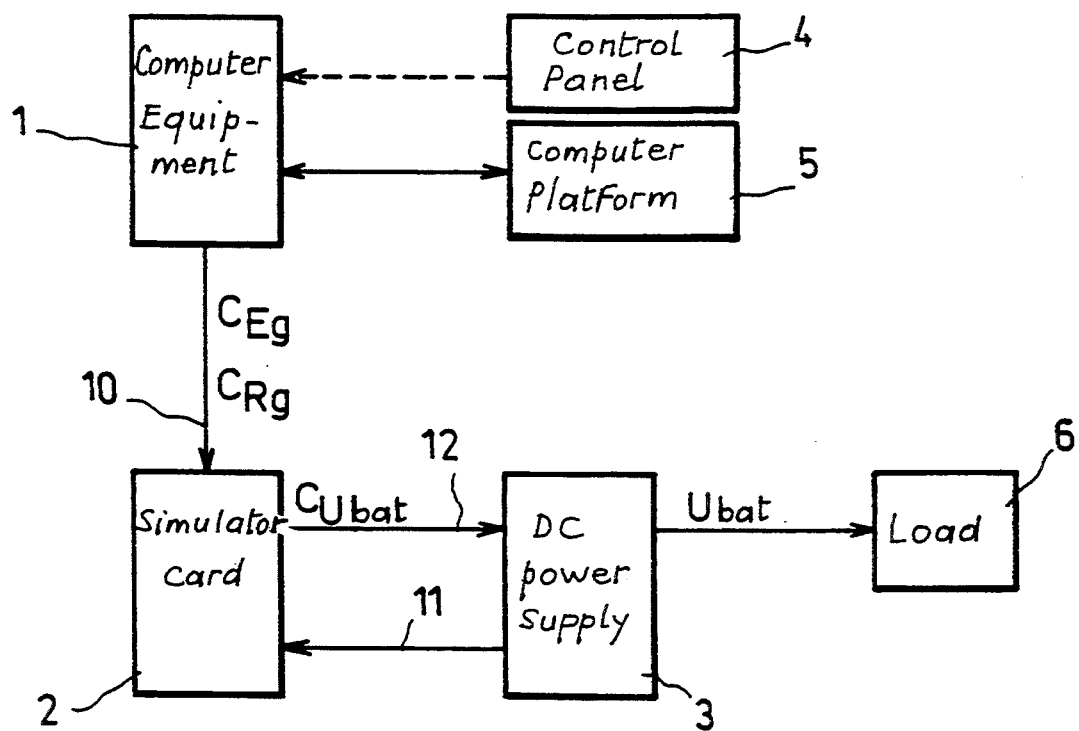
FIG. 1 is a block diagram of a battery simulator of the invention.

FIG. 1 is a block diagram of a battery simulator of the invention. Such a simulator comprises three main portions: computer equipment 1; an electronic simulation card 2; and a DC power supply 3.

The computer equipment 1 is made in conventional manner by means of a computer, e.g. having a microprocessor of sufficient power to enable the various operations required for simulating a thermal battery to be performed. In particular, it includes temporary memory (RAM type memory) or permanent memory (ROM type memory) containing one or more simulation profiles, i.e. sequences of samples (Eg, Rg) appropriate for each instant (t) of a simulation, such that throughout the duration of a simulation, respective instantaneous values of the e.m.f., Eg, and of the internal resistance, Rg, of a given battery are made available.

The computer must also make it possible for these various samples to be read sequentially (periodically or otherwise) while a simulation is being performed. At a given instant, each sample fixes the values of the two parameters $C_{Eg}$ and $C_{Rg}$ that are applied to the electronic simulation card 2. The rate at which the parameters $C_{Eg}$ and $C_{Rg}$ are updated is a function of the simulation process running on the computer equipment 1. Several algorithms are thus possible, using either fixed period sampling or else incremental sampling, for example.

A control panel 4 is preferably connected to the computer equipment 1 in order to enable an operator to control the simulator and in order to enable the internal generation of simulation profiles within the computer equipment to be based on data input by the operator. Advantageously, the control panel may include manual selector devices to enable fixed values to be given to the e.m.f. and to the internal resistance, in order to enable the simulator to operate at a fixed point.

In addition, the computer equipment 1 may be connected to one or more computer platforms 5 via a communications bus either for the purpose of remotely controlling the simulator, or else for downloading different simulation profiles.

The simulation card 2 is connected firstly to the computer equipment 1 via a digital bus 10 over which the values of the parameters $C_{Eg}$ and $C_{Rg}$ are conveyed, and secondly to a power supply unit 3. The card responds to the above values of $C_{Eg}$ and $C_{Rg}$, and to a measured value for the current 11 delivered by the power supply (which current is determined by a load 6 connected thereto), to generate a battery reference voltage $C_{Ubat}$ 12 for said power supply 3.

The DC power supply 3 is a conventional power supply programmable by a standardized analog voltage in the range 0 volts to 10 volts, for example, and it delivers battery voltage $U_{bat}$ on the basis of the battery reference voltage $C_{Ubat}$ as delivered by the simulation card 2. The particular kind of power supply used, e.g. a series regulated power supply or a chopper power supply, depends on the overall passband required by the simulator, and the person skilled in the art is quite capable of making an appropriate selection, and can also, without any special difficulty, add various safety devices thereto such as devices for providing protection against voltage surges, current surges, or mains switching.

If the power supply is provided with an option for measuring current by standardized analog voltage, it is possible to avoid using an external shunt or any other current measurement means in the apparatus of the invention for the purpose of evaluating the current taken by the load 6.

Naturally, the simulator may simulate a plurality of thermal batteries simultaneously, in which case it is fitted with as many battery simulation cards 2 and power supply units 3 as it has simulation channels. The power of the computer equipment 1 should be appropriate for controlling said channels simultaneously.

In addition, it should be observed that such a device of the invention which constitutes a system that is entirely self contained may be used not only for simulating thermal batteries, but also any other voltage source of dynamically-varying internal resistance.

Figure 2:
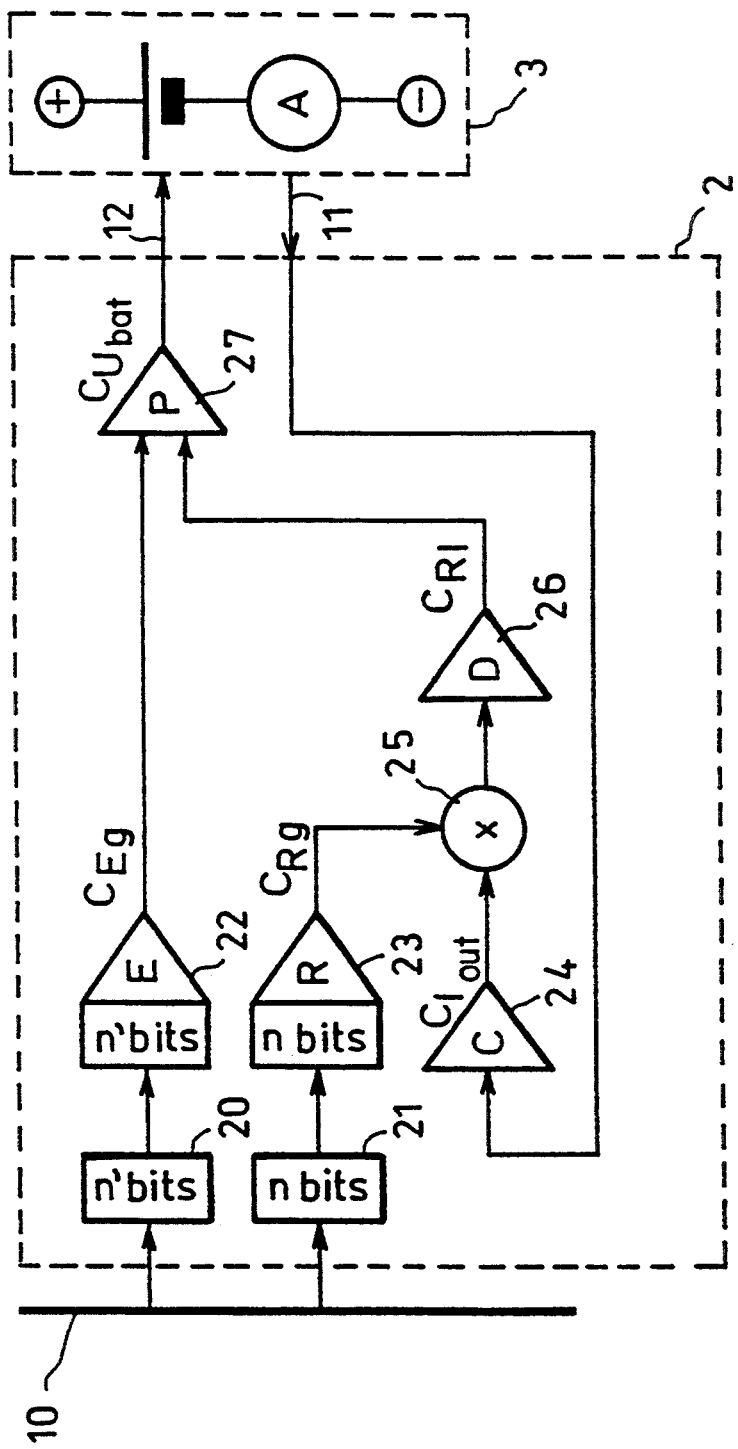
FIG. 2 is circuit diagram of a battery simulation card used in the FIG. 1 simulator.

FIG. 2 is a theoretical circuit diagram for the simulation card 2 in a simulator of the invention.

This electronics card is connected to the computer equipment 1 by the digital bus 10. The computer equipment 1 uses this bus at instants that are defined by the simulation algorithm to load (digital) values for the two references $C_{Eg}$ and $C_{Rg}$ into the simulation card 2.

Each of the parameters $C_{Eg}$ and $C_{Rg}$ is associated with a corresponding register 20 or 21 whose contents is transformed by a corresponding one of two digital-to-analog converters (DAC) 22 or 23 into standardized analog voltages. The number of bits used by these converters is a function of the required resolution, taking account of the dynamic range of the two physical magnitudes $E_g$ and $R_g$, as defined by $E_{gMAX}$ and $R_{gMAX}$, respectively.

The current drawn by the load 6, $I_{out}$ is measured by an ammeter function A, with current measurement being performed in analog manner (by transforming the current into a voltage).

This function A may be implemented in various different ways, e.g. by using a genuine ammeter, or else, as mentioned above, by means of a shunt, or by means of a current-measurement facility directly available in certain programmable power supplies.

The result of the measurement 11 is applied directly to the simulation card 2 at an instrumentation amplifier stage 24 whose gain C serves to match the dynamic range of current measurement to that of the reference values $C_{Eg}$ and $C_{Rg}$ obtained at the outputs from the converters 22 and 23. A new current reference $C_{Iout}$ is obtained at the output from the amplifier 24. It should be observed that it is not essential for an instrumentation amplifier to be used, but it is preferable in order to facilitate such dynamic range matching.

The reference value $C_{Iout}$ and the reference value $C_{Rg}$ constitute two inputs to an analog multiplier 25 which delivers the product $C_{Rg} \times C_{Iout}$ representative of the voltage drop across the internal resistance $R_g$ of the battery. A second amplifier 26 placed at the output of the multiplier 25 and having gain D also serves in this case to control the dynamic range of the equipment, with the gain D being chosen so that it satisfies the relationship $D \cdot E_{gMAX} = R_{gMAX} \cdot I_{outMAX}$, thus delivering a reference value $C_{RI}$ which is subtracted from the reference value $C_{Eg}$ in a subtractor-amplifier 27 whose gain P makes it possible to obtain a standardized reference output voltage $C_{Ubat}$ 12 for controlling the DC power supply 3.

In this way, the output voltage of the power supply 3 is servo-controlled to three parameters: $E_g$, $R_g$, and $I_{out}$, thereby making it possible to cause an entirely conventional power supply (programmable by standardized analog voltage) to artificially reproduce behavior that is similar to that of a thermal battery modelled on the equation $U_{bat} = E_g - (R_g \times I_{out})$.

The voltage drop across the internal resistance of the battery, i.e. the term $(R_g \times I_{out})$ in the above modelling equation, is simulated by permanently subtracting from the reference $C_{Eg}$ a quantity that is equivalent to a value in volts that is equal to the product $(R_g \times I_{out})$.

To do this, the delivered current is measured constantly, and the measurement is made use of in the form of a standardized analog voltage which is an image of $I_{out}$, $C_{Iout}$. On the basis of the two magnitudes $C_{Rg}$ and $C_{Iout}$, the reference $C_{RI}$ is calculated representative of the voltage drop across the internal resistance of the battery.

$$C_{RI} = \gamma \times (C_{Rg} \times C_{Iout}), \gamma \in \Re$$

$$C_{RI} = \delta \times (R_g \times I_{out}), \delta \in \Re$$

The four coefficients $\alpha$, $\beta$, $\gamma$, and $\delta$ have values that guarantee the integrity of the transformations between the physical magnitudes, volts, ohms, amps, and the various reference values.

For example, a two-voltage thermal battery simulator (operating at 10 V and at 36 V) and a single voltage thermal battery simulator (operating at 24 V) has been implemented.

FIG. 3 is a block diagram of a two-voltage implementation. It naturally includes the various items described above, however it has two battery simulation cards, a first card 2a that generates a reference $C_{Ubat}$ for a power supply 3a that delivers a nominal voltage of 10 V, and a second card 2b that generates a reference for a power supply 3b that delivers a nominal voltage of 36 V. The computer equipment 1 has a central unit 30 and an input/output card 31. The card 30 and the two battery simulation cards 2a and 2b are interconnected by a VME type standard bus. The card 31 is connected to the CPU card via a parallel digital bus of a different type.

Power supply cards 32, 33 and 34 serve to convert an AC mains supply 35, e.g. at 220 V, into reference voltages for the various cards, while the power supply units are directly connected to mains. The operator interface 4 is constituted by a control and display unit connected to I/O card 31. More precisely, the interface has pushbuttons intended, in particular, for starting a simulation, and code wheels to enable the operator to enter the e.m.f. characteristics and the internal resistance characteristics for a given operating mode where the internal resistance and voltage values are fixed. A communications link 37 (e.g. of the RS 232 type) connects the central processor unit card 30 directly to a link with an external computer platform, thus enabling the various functions of the simulator to be remotely controlled, and also enabling possible simulation profiles to be downloaded which are present, in use, in the simulator memory in the central unit card 30.

We claim:

1. A simulator for simulating voltage delivered to a load by a thermal battery during its active life cycle, comprising:

first means for providing successive samples of an e.m.f. parameter Eg, said successive samples of parameter Eg corresponding to values of Eg occurring during an active life cycle of a thermal battery under real operating conditions;

second means for providing successive samples of an internal resistance parameter Rg, said successive samples of parameter Rg corresponding to values of Rg occurring during an active life cycle of a thermal battery under real operating conditions;

third means for providing a signal corresponding to current flowing through the load;

a multiplier receiving as inputs thereto signals corresponding to outputs of said second means and said third means;

a subtractor receiving as inputs thereto signals corresponding to outputs of said first means and said multiplier;

a controllably variable voltage supply for applying to the load a voltage corresponding to an output of said subtractor; and means for detecting current flowing through the load in response to voltage applied thereto by said voltage supply, and for providing a signal corresponding thereto to said third means.

2. A simulator for simulating voltage delivered to a load by a thermal battery during its active life cycle, comprising:

first means for providing successive samples of an e.m.f. parameter Eg, said successive samples of parameter Eg corresponding to values of Eg occurring during an active life cycle of a thermal battery under real operating conditions;

second means for providing successive samples of an internal resistance parameter Rg, said successive samples of parameter Rg corresponding to values of Rg occurring during an active life cycle of a thermal battery under real operating conditions;

a current detector sensitive to current flow through the load and providing an output indicative thereof;

a processing circuit for combining outputs of said first means, said second means and said current detector; and a controllably variable voltage supply for applying to the load a voltage corresponding to an output of said processing circuit.

3. The simulator of claim 2, wherein said processing circuit subtracts from a signal corresponding to parameter Eg a signal corresponding to a voltage drop due to parameter Rg and the load current.

* * * * *